United States Patent
Karakane et al.

(10) Patent No.: US 10,903,200 B2
(45) Date of Patent: Jan. 26, 2021

(54) SEMICONDUCTOR DEVICE MANUFACTURING METHOD

(71) Applicant: TOSHIBA MEMORY CORPORATION, Tokyo (JP)

(72) Inventors: Yuji Karakane, Nagoya Aichi (JP); Masatoshi Fukuda, Yokkaichi Mie (JP); Soichi Homma, Yokkaichi Mie (JP); Naoyuki Komuta, Kawasaki Kanagawa (JP); Yukifumi Oyama, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/793,323

(22) Filed: Feb. 18, 2020

(65) Prior Publication Data

US 2020/0185373 A1 Jun. 11, 2020

Related U.S. Application Data

(63) Continuation of application No. 15/445,988, filed on Mar. 1, 2017, now Pat. No. 10,600,773.

(30) Foreign Application Priority Data

Sep. 9, 2016 (JP) .................................. 2016-176671

(51) Int. Cl.
*H01L 21/77* (2017.01)
*H01L 25/065* (2006.01)
(Continued)

(52) U.S. Cl.
CPC ............ *H01L 25/50* (2013.01); *H01L 21/565* (2013.01); *H01L 21/6836* (2013.01);
(Continued)

(58) Field of Classification Search
CPC ......... H01L 2224/0239; H01L 2224/81; H01L 25/0657; H01L 2924/181; H01L 2225/06517; H01L 2224/02372
See application file for complete search history.

(56) References Cited

U.S. PATENT DOCUMENTS 7,824,960 B2 * 11/2010 Hao ........................ H01L 24/14
438/109
7,982,297 B1 7/2011 Heo
(Continued)

FOREIGN PATENT DOCUMENTS

CN 104064486 A 9/2014
CN 104425464 A 3/2015
(Continued)

OTHER PUBLICATIONS

Japanese Office Action dated Jul. 12, 2019, mailed in counterpart Japanese Application No. 2016-176671, 8 pages (with translation).

*Primary Examiner* — Bradley Smith
*Assistant Examiner* — David J Goodwin
(74) *Attorney, Agent, or Firm* — Kim & Stewart LLP (57) ABSTRACT

A semiconductor device manufacturing method includes stacking a second semiconductor chip on a first surface of a first semiconductor chip such that the at bump electrode overlies the position of a first through silicon via in the first semiconductor chip, stacking a third semiconductor chip on the second semiconductor chip such that a second bump electrode on the second semiconductor chip overlies the position of a second through silicon via in the third semiconductor chip to form a chip stacked body, connecting the first and second bump electrodes of the chip stacked body to the first and the second through silicon vias by reflowing the bump material, placing the chip stacked body on the first substrate such that the first surface of the first semiconductor (Continued)

chip faces the second surface, and sealing the second surface and the first, second, and third semiconductor chips with a filling resin.

15 Claims, 6 Drawing Sheets

(51) Int. Cl.
| | |
|---|---|
| *H01L 25/00* | (2006.01) |
| *H01L 21/56* | (2006.01) |
| *H01L 21/683* | (2006.01) |
| *H01L 23/00* | (2006.01) |
| *H01L 25/18* | (2006.01) |
| *H01L 23/31* | (2006.01) |

(52) U.S. Cl.
CPC ............. *H01L 24/13* (2013.01); *H01L 24/16* (2013.01); *H01L 24/17* (2013.01); *H01L 24/32* (2013.01); *H01L 24/73* (2013.01); *H01L 24/81* (2013.01); *H01L 25/0657* (2013.01); *H01L 25/18* (2013.01); *H01L 23/3128* (2013.01); *H01L 2221/68354* (2013.01); *H01L 2221/68386* (2013.01); *H01L 2224/0401* (2013.01); *H01L 2224/13025* (2013.01); *H01L 2224/16145* (2013.01); *H01L 2224/16146* (2013.01); *H01L 2224/16225* (2013.01); *H01L 2224/16227* (2013.01); *H01L 2224/1703* (2013.01); *H01L 2224/17181* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/81065* (2013.01); *H01L 2224/81815* (2013.01); *H01L 2224/92242* (2013.01); *H01L 2224/97* (2013.01); *H01L 2225/06513* (2013.01); *H01L 2225/06517* (2013.01); *H01L 2225/06541* (2013.01); *H01L 2225/06555* (2013.01); *H01L 2924/1033* (2013.01); *H01L 2924/10253* (2013.01); *H01L 2924/10272* (2013.01); *H01L 2924/1431* (2013.01); *H01L 2924/1434* (2013.01); *H01L 2924/1438* (2013.01); *H01L 2924/14511* (2013.01); *H01L 2924/15311* (2013.01); *H01L 2924/15313* (2013.01)

(56) References Cited

U.S. PATENT DOCUMENTS

| | | | |
|---|---|---|---|
| 9,184,153 B2* | 11/2015 | Lu | ........................ H01L 25/0657 |
| 9,449,949 B2* | 9/2016 | Komuta | ................... H01L 24/97 |
| 9,595,507 B2 | 3/2017 | Kurita | |
| 9,881,910 B2 | 1/2018 | Koopmans | |
| 10,096,574 B2 | 10/2018 | Tsukiyama et al. | |
| 2005/0280160 A1 | 12/2005 | Kim et al. | |
| 2008/0248611 A1 | 10/2008 | Hanada et al. | |
| 2010/0261311 A1 | 10/2010 | Tsuji | |
| 2012/0049354 A1 | 3/2012 | Sawayama et al. | |
| 2014/0284817 A1* | 9/2014 | Sato | ........................ H01L 25/50 |
| | | | 257/777 |
| 2015/0069596 A1 | 3/2015 | Kawasaki et al. | |
| 2015/0069634 A1 | 3/2015 | Oyama et al. | |
| 2015/0262847 A1* | 9/2015 | Komuta | ................. H01L 21/561 |
| | | | 257/737 |
| 2015/0262878 A1* | 9/2015 | Sato | ........................ H01L 25/074 |
| | | | 257/777 |
| 2016/0079222 A1* | 3/2016 | Sato | ..................... H01L 25/0657 |
| | | | 257/738 |
| 2017/0170158 A1 | 6/2017 | Koopmans | |

FOREIGN PATENT DOCUMENTS

| | | |
|---|---|---|
| JP | 2014183278 A | 9/2014 |
| JP | 2015018870 A | 1/2015 |
| JP | 2016063017 A | 4/2016 |
| WO | 2015151417 A1 | 10/2015 |

* cited by examiner

SEMICONDUCTOR DEVICE MANUFACTURING METHOD

CROSS-REFERENCE TO RELATED APPLICATIONS

This application is a continuation of U.S. patent application Ser. No. 15/445,988, filed on Mar. 1, 2017, which is based upon and claims the benefit of priority from Japanese Patent Application No. 2016-176671, filed Sep. 9, 2016, the entire contents of each of which are incorporated herein by reference.

FIELD

Embodiments described herein relate generally to a semiconductor device manufacturing method.

BACKGROUND

There has been proposed a method for stacking multiple semiconductor chips together and sealing the stacked semiconductor chips in a resin for a device required to have a large capacity such as a NAND flash memory. Attention has been paid to a stacking scheme based on TSV (through silicon via) in order to further increase a transmission rate of signals in or out of each semiconductor chip.

DETAILED DESCRIPTION

Embodiments provide a semiconductor device manufacturing method capable of more efficiently sealing a semiconductor chip stacked body in a resin.

In general, according to one embodiment, a semiconductor device manufacturing method includes providing a first semiconductor chip comprising a first surface and a first bump electrode extending from the first surface, providing a second semiconductor chip comprising a second bump electrode and a first through silicon via, providing a third semiconductor chip comprising a second through silicon via, and providing a first substrate comprising a second surface, stacking the second semiconductor chip on the first surface of the first semiconductor chip such that the first bump electrode overlies the position of the first through silicon via, stacking a third semiconductor chip on the second semiconductor chip such that the second bump electrode overlies the position of the second through silicon via, to form a chip stacked body, and connecting the first and second bump electrodes of the chip stacked body to the first and the second through silicon vias by reflowing the bump material, placing the chip stacked body on the first substrate such that the first surface of the first semiconductor chip faces the second surface, and sealing the second surface and the first, second, and third semiconductor chips with a filling resin.

First Embodiment

A semiconductor device according to a first embodiment will be described hereinafter with reference to FIGS. 1 to 7. In the following illustration of the drawings, like elements are denoted by the same reference symbols. However, the drawings may differ from an actual semiconductor device in the relationship between thicknesses and planar dimensions, a scaling ratio, and the like, and are provided herein as schematics.

Figure 1:
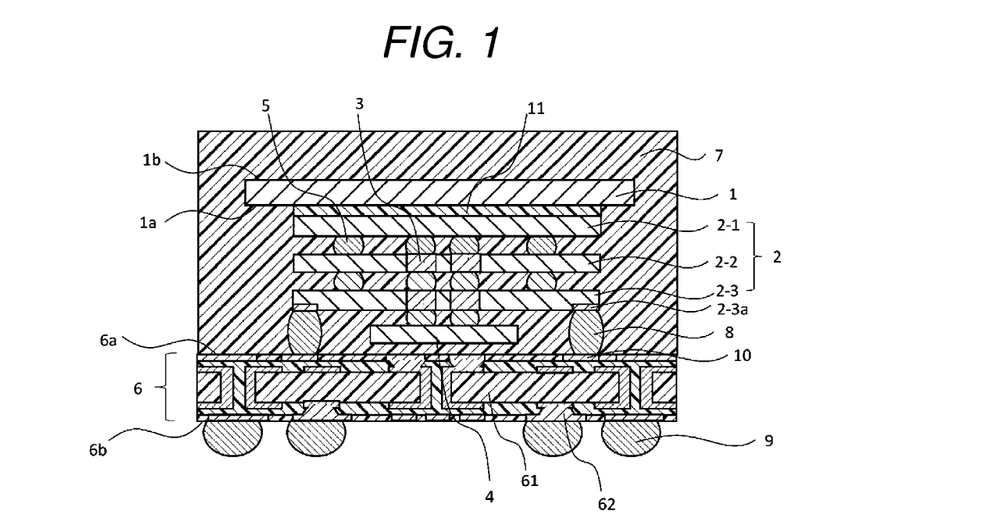
FIG. 1 is a cross-sectional view illustrating a configuration of a semiconductor device according to a first embodiment.

FIG. 1 is a cross-sectional view illustrating a configuration of the semiconductor device according to the first embodiment. As illustrated in FIG. 1, the semiconductor device according to the present embodiment includes a chip stacked body, which includes a supporting substrate 1, semiconductor chips 2, through silicon vias (TSV) 3, a semiconductor chip 4 (logic LSI), metal bumps 5, a wiring substrate 6, and a resin mold 7.

The semiconductor device according to the present embodiment is configured such that the chip stacked body, including the supporting substrate 1 and the semiconductor chips 2, is mounted onto the wiring substrate 6 by flip-chip bonding and the chip stacked body on the wiring substrate 6 and a resin is molded over the chip stacked body and between the individual components thereof to seal the gaps between the semiconductor chips 2.

The supporting substrate 1 has a first surface 1a that faces the wiring substrate 6 and a second surface 1b on the opposite side of the wiring substrate from the first surface 1a. A semiconductor chip 2-1 is bonded to the first surface 1a of the supporting substrate 1 with an adhesive 11.

For example, a metal plate such as a lead frame, a silicon substrate or a film material is used as the supporting substrate 1. Examples of the adhesive 11 include a die attach film and a resin.

A plurality of metal bumps 5 are formed on a surface of the semiconductor chip 2-1 facing away from the supporting substrate 1, and the metal bumps 5 are electrically connected to the through silicon vias 3 formed in a semiconductor chip 2-2. The through silicon vias 3 in the semiconductor chip 2-2 are also similarly electrically connected to the through silicon vias 3 formed in a semiconductor chip 2-3 by the metal bumps 5. A rewiring layer (not illustrated) is formed on the wiring substrate 6 side of the semiconductor chip 2-3. The through silicon vias 3 in the semiconductor chip 2-3 are electrically connected to the semiconductor chip 4 by the metal bumps 5. The supporting substrate 1, the semiconductor chips 2, and the semiconductor chip 4 are collectively referred to as the "chip stacked body".

Examples of the semiconductor chips 2 include memory chips of a NAND flash memory or the like. A substrate such as a silicon substrate, SiC or GaN can be used for the semiconductor chips 2 and 4; however, the type of the substrate is not limited to a specific one.

The through silicon vias 3 provided in the semiconductor chips 2-2 and 2-3 transfer potentials and signals to the semiconductor chips 2-1 and 2-2.

The semiconductor chips 2 are connected in parallel to the common semiconductor chip 4 (by bus connection). That is, data input/output lines of the plurality of semiconductor chips 2 are connected in parallel to common data buses formed by the through silicon vias 3 in a chip stacking direction.

For example, Au, Ni, Cu, Sn, Bi, Zn, In or an alloy thereof is used for the metal bumps 5. Electrode pads containing Au, Ni, Cu, Al, Pd or the alloy thereof may be employed as an alternative to the metal bumps.

While three semiconductor chips 2 are illustrated in the present embodiment, the number of semiconductor chips 2 is not limited to a specific number. Similarly, the number of the metal bumps 5 is not limited to a specific number.

The wiring substrate 6 includes a resin insulating layer 61 and a metal wiring layer 62. The insulating layer 61 includes a core layer and a build-up layer. The chip stacked body is placed on the wiring substrate 6 so that the semiconductor chip 4 is closest to the wiring substrate 6 and the supporting substrate 1 is farthest from the wiring substrate 6.

The wiring substrate 6 has a first surface 6a on which the chip stacked body is placed and a second surface 6b on the opposite side thereof as the first surface 6a, as illustrated in, for example, FIG. 1. External connection terminals 9 are formed on the second surface 6b of the wiring substrate 6. When the semiconductor device is used as a BGA package, solder balls or protruding terminals plated with solder, Au or the like are used as the external connection terminals 9. When the semiconductor device is used as an LGA package, metal lands are used as the external connection terminals 9.

Internal connection terminals 10 are provided on the first surface 6a of the wiring substrate 6. The internal connection terminals 10 on the first surface 6a side of the wiring substrate 6 are connected to electrode pads 2-3a on the lowermost of the semiconductor chips 2 (chip 2-3) of the chip stacked body of by, for example, solder bumps 8. The internal connection terminals 10 function as connection sections (connection pads) when the wiring substrate 6 is connected to the chip stacked body, and are electrically connected to the external connection terminals 9 through a wiring network of the wiring substrate 6.

The chip stacked body located on the first surface 6a of the wiring substrate 6, the metal bumps 5, and the solder bumps 8 are entirely covered with the molded resin 7 and sealed therein.

Figure 2:
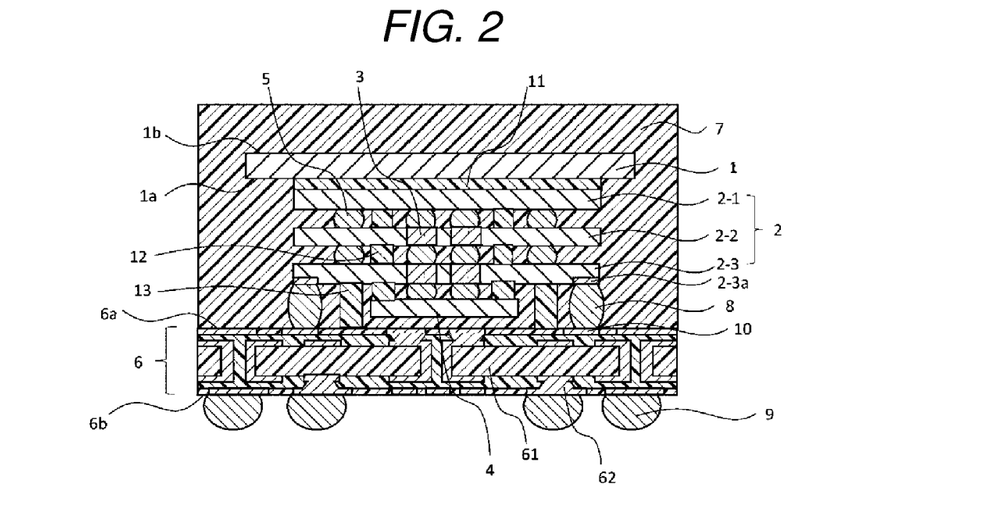
FIG. 2 is a cross-sectional view illustrating the configuration of the semiconductor device according to the first embodiment.

As illustrated in FIG. 2, an adhesive 12 may be provided between the semiconductor chips 2 and between the lowermost of the semiconductor chips 2 and the semiconductor chip 4, and an adhesive 13 may be provided between the wiring substrate 6 and the chip stacked body. Providing the adhesives 12 and 13 can ensure the strong connection among the semiconductor chips 2 and between the wiring substrate 6 and the chip stacked body and can reduce misalignment therebetween.

A semiconductor device manufacturing method according to the present embodiment will next be described.

FIGS. 3A to 7 are cross-sectional views of the semiconductor device during the semiconductor device manufacturing method according to the present embodiment in the order of manufacturing processes.

Figure 3A:
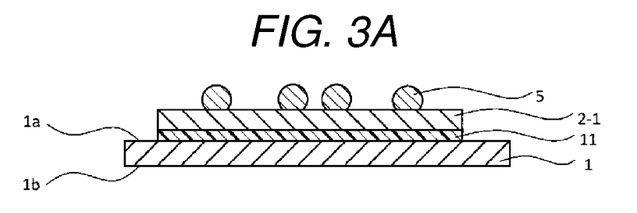
FIGS. 3A and 3B are sectional views of the semiconductor device during steps of the manufacturing method according to the first embodiment.

As illustrated in FIG. 3A, the adhesive 11 is provided on the surface of the semiconductor chip 2-1, which is opposite to the surface (first surface) on which the metal bumps 5 are formed, and the adhesive 11 bonds the semiconductor chip 2-1 to the first surface 1a of the supporting substrate 1.

Figure 3B:
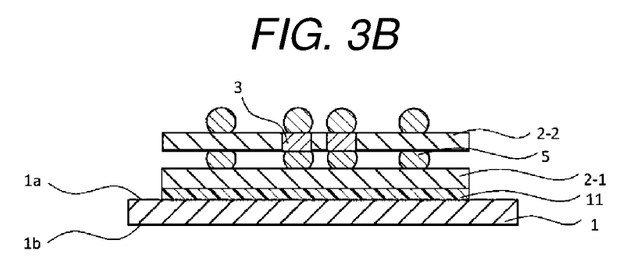

Next, as illustrated in FIG. 3B, the semiconductor chip 2-2 on which the through silicon vias 3 are formed in advance and which includes the metal bumps 5 is stacked on the semiconductor chip 2-1. The through silicon vias 3 are formed by, for example, a BSV (Back Side VIA) wafer process. The BSV process is a method for forming TSVs by forming an LSI having semiconductor elements and wirings and front electrodes on a front surface of a substrate, forming holes from a rear surface of the substrate toward the wirings, and embedding a metal into the holes.

Figure 4A:
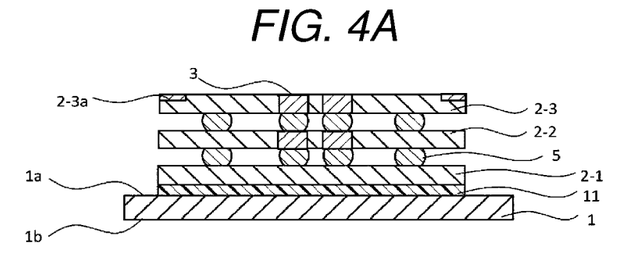
FIGS. 4A and 4B are sectional views of the semiconductor device during steps of the manufacturing method according to the first embodiment.

At this time, the semiconductor chip 2-2 is stacked on the semiconductor chip 2-1 so that the through silicon vias 3 formed in the semiconductor chip 2-2 overlap the metal bumps 5 formed on the semiconductor chip 2-1 vertically in the Z-axis direction generally perpendicular to the supporting substrate 1. Similarly, the semiconductor chip 2-3 including the through silicon vias 3 is stacked on the semiconductor chip 2-2 (FIG. 4A). The semiconductor chip 2-3 includes the rewiring layer (not illustrated) and the electrode pads 2-3a on, for example, the surface opposite to the semiconductor chip 2-2. The semiconductor chips 2 may be stacked by a method for forming the metal bumps 5 on the supporting substrate 1 side, of the semiconductor chips 2-2 and 2-3 in advance instead of forming the metal bumps 5 on the semiconductor chip 2-2 in advance and then stacking the semiconductor chips 2-1 to 2-3 as described above.

Figure 4B:
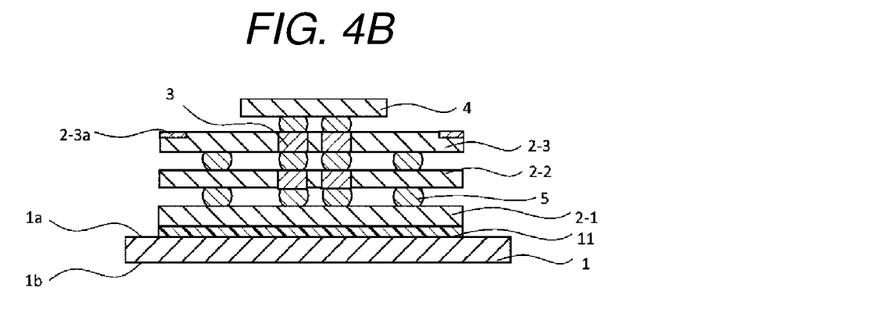

As illustrated in FIG. 4B, the semiconductor chip 4 on which the metal bumps 5 are formed is then stacked on the semiconductor chip 2-3. At this time, the metal bumps 5 are placed so as to be located on the through silicon vias 3 of the semiconductor chip 2-3. It is noted that the rewiring layer may be formed on the surface, which faces the wiring substrate 6, of the semiconductor chip 2-3. In that case, the metal bumps 5 are placed on the rewiring layer. In this way, the chip stacked body is completed.

The chip stacked body is formed at a temperature at which the respective semiconductor chips 2 are stacked and which is lower than a melting temperature of the metal bumps 5 to prevent the mechanical connection among the semiconductor chips 2. Thereby, it is possible to reduce the risk of making the metal bumps 5 brittle by repetition of melting and solidification of the metal bumps 5 and of breaking of the connection sections of the semiconductor chips 2 during stacking the semiconductor chips 2.

Since the metal bumps 5 between the semiconductor chips 2 are not mechanically connected during the manufacturing as described above, misalignment possibly occurs between the vertically overlapping metal bumps 5 of the semiconductor chips 2 during the manufacturing processes. Preferably, therefore, reduction reflow is performed on the chip stacked body after the chip stacked body is formed by stacking all the semiconductor chips 2 and before resin seal in order to prevent the misalignment. Alternatively, as illustrated in FIG. 2, a method for forming the adhesive (adhesive resin) 12 on the surfaces of the semiconductor chips 2 in advance and for fixing the semiconductor chips 2 using the adhesive 12 may be adopted.

Figure 5:
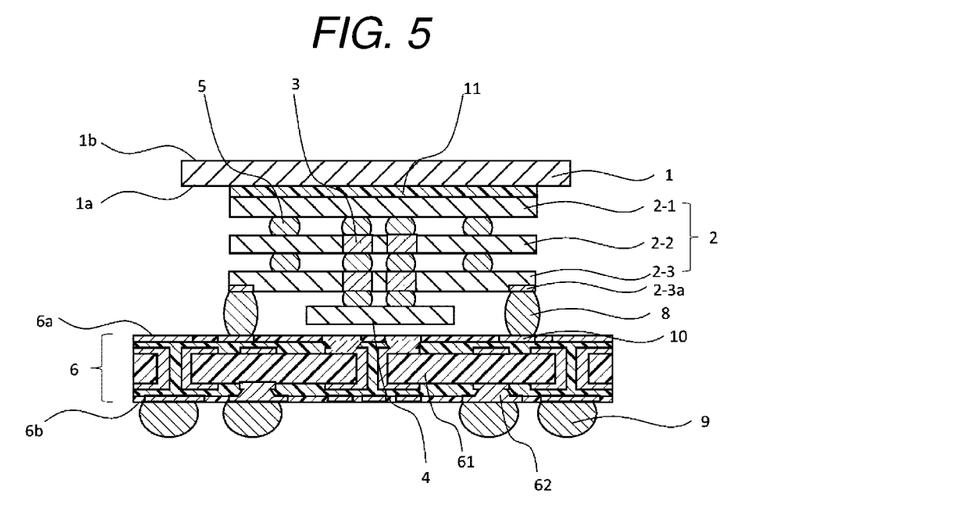
FIG. 5 is a sectional view of the semiconductor device during a step of the manufacturing method according to the first embodiment.

As illustrated in FIG. 5, the solder bumps 8 are then formed on the internal connection terminals 10 on the first surface 6a of the wiring substrate 6 having wirings, and the chip stacked body manufactured as described above is mounted on the first surface 6a by flip-chip bonding. At this time, the chip stacked body is mounted on the first surface 6a of the wiring substrate 6 so that the electrode pads 2-3a formed on the semiconductor chip 2-3 and the solder bumps 8 on the wiring substrate 6 are aligned. Furthermore, the flip-chip bonding may be carried out at a temperature lower than a melting temperature of the solder bumps 8 formed on the wiring substrate 6.

Alternatively, a method for forming the adhesive 13 on the wiring substrate 6 in advance and fixing the chip stacked body to the wiring substrate 6 as illustrated in FIG. 2 before mounting the chip stacked body may be adopted.

The wiring substrate 6 on which the chip stacked body is placed is then heated in a reduction atmosphere to melt the metal bumps 5 on the semiconductor chips 2 and the solder bumps 8 on the wiring substrate 6. Thereby, electrical connection is established among the semiconductor chips 2 and between the chip stacked body and the wiring substrate 6.

Figure 6:
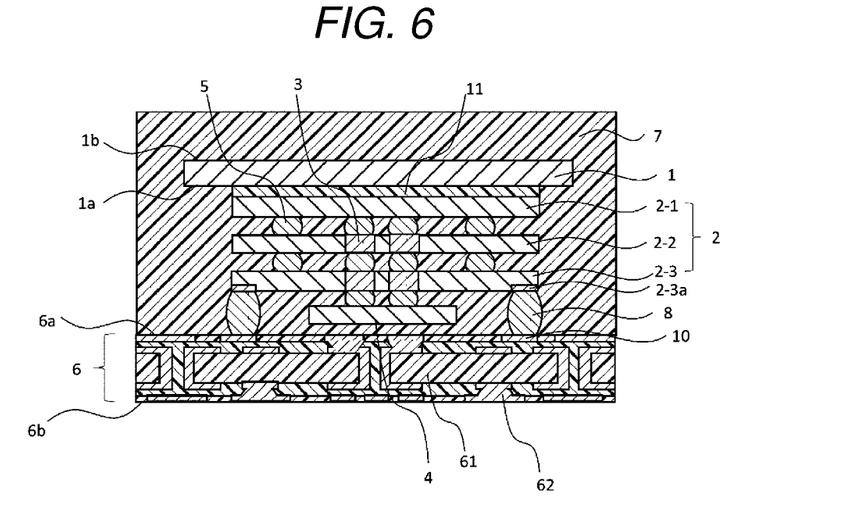
FIG. 6 is a sectional view of the semiconductor device during a step of the manufacturing method according to the first embodiment.

As illustrated in FIG. 6, resin sealing is then performed on the wiring substrate 6 using the molding resin 7 by transfer molding so as to collectively seal gaps among the semiconductor chips 2, and a gap between the chip stacked body and the wiring substrate 6.

Figure 7:
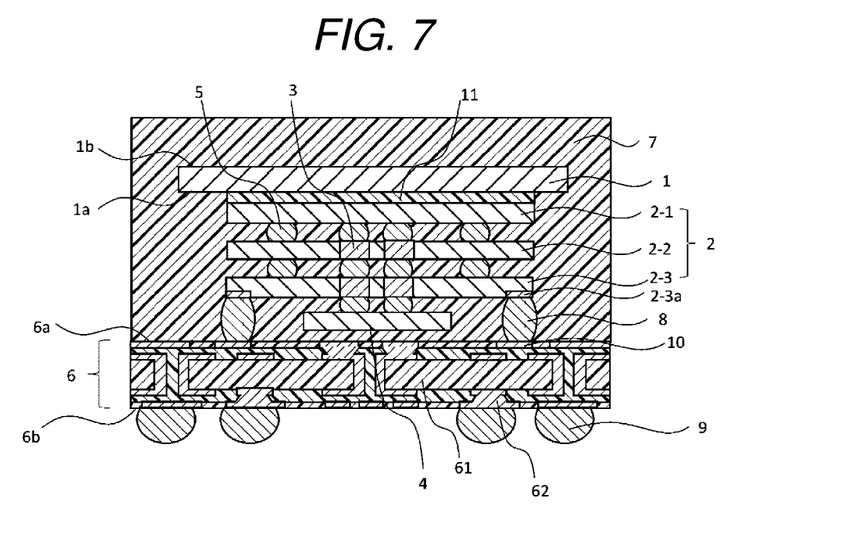
FIG. 7 is a sectional view of the semiconductor device during a step of the manufacturing method according to the first embodiment.

As illustrated in FIG. 7, the external connection terminals 9 are formed on the second surface 6b of the wiring substrate 6. Finally, individual semiconductor devices are diced from the wiring substrate 6 into devices (subjected to singulation) (not illustrated).

Through the aforementioned processes, the semiconductor device according to the present embodiment is completed.

The semiconductor device manufacturing method according to the present embodiment enables the collective resin seal by transfer molding without filling the resin among the chips by an underfill material or the like after forming the chip stacked body. It is, therefore, possible to reduce the number of manufacturing processes.

Furthermore, when the chip stacked body is formed, the metal bumps are connected to the through silicon vias during exposing the stacked body and the wiring substrate to the reduction atmosphere after all the semiconductor chips are stacked. Therefore, it is possible to reduce the risk of making the metal bumps 5 brittle by repetition of melting and solidification of the metal bumps 5 and of breaking of the connection sections of the semiconductor chips 2.

Second Embodiment

A second embodiment will next be described with reference to FIGS. 8, 9A, and 9B.

The second embodiment differs from the first embodiment in that a supporting substrate is not used. The other configurations are the same as those according to the first embodiment.

Figure 8:
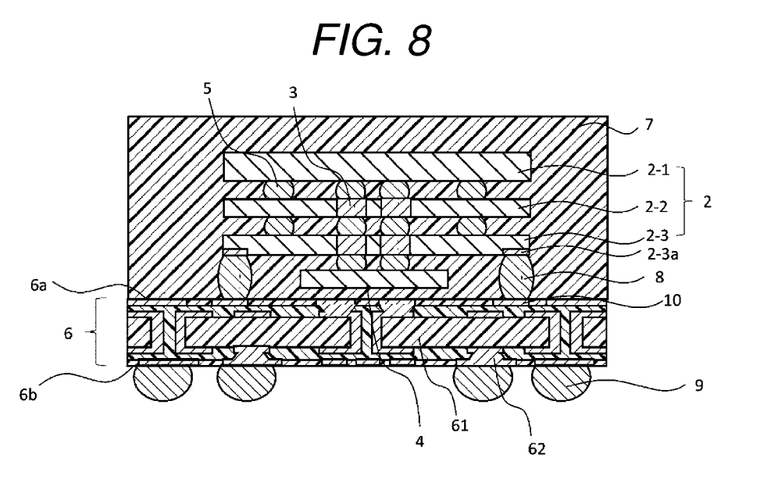
FIG. 8 is a cross-sectional view illustrating a configuration of a semiconductor device according to a second embodiment.

FIG. 8 is a cross-sectional view illustrating a configuration of a semiconductor device according to the second embodiment. As illustrated in FIG. 8, the semiconductor device according to the present embodiment does not use the supporting substrate as does the first embodiment. That is, the semiconductor chip 2-1 is the uppermost chip in the chip stacked body on the wiring substrate. The other configurations are the same as those of the first embodiment, and therefore will be omitted.

Figure 9A:
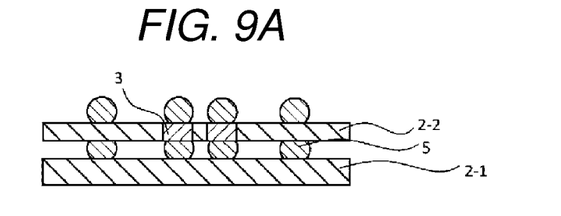
FIGS. 9A and 9B are sectional views of a semiconductor device during steps of the manufacturing method according to the second embodiment.
Figure 9B:
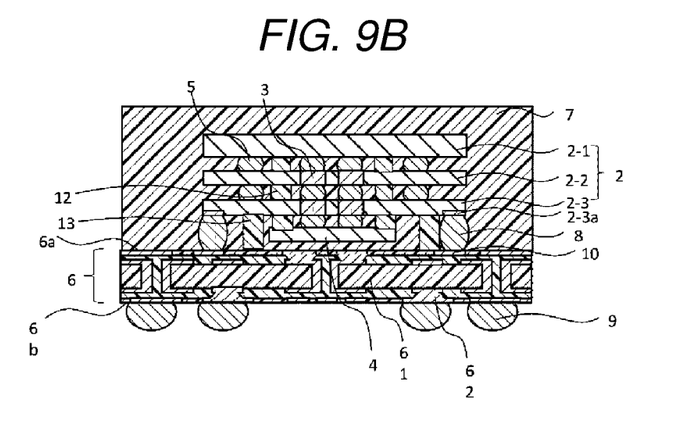

In a semiconductor device manufacturing method according to the second embodiment, the semiconductor chip 2-2 in which the through silicon vias 3 are formed and on which the metal bumps 5 are formed in advance is stacked on the semiconductor chip 2-1 on which the metal bumps 5 are formed in advance, as illustrated in FIG. 9A. At this time, the semiconductor chip 2-2 is stacked on the semiconductor chip 2-1 so that the metal bumps 5 on the semiconductor chip 2-1 positionally overlap the through silicon vias 3 in the semiconductor chip 2-2 in the Z-axis direction generally perpendicular to the semiconductor chip 2-1. Subsequent processes are the same as those in the first embodiment, and therefore will be omitted. As illustrated in FIG. 9B, the adhesives 12 and 13 may be used among the semiconductor chips 2 and 4 and between the chip stacked body and the wiring substrate 6, respectively.

The semiconductor device according to the present embodiment described so far exhibits the same advantages as those of the first embodiment, and further can achieve reductions in the number of processes and cost since the chip stacked body can be formed without using the supporting substrate as compared with the first embodiment.

The other manufacturing method according to the second embodiment will next be described with reference to FIGS. 10A and 10B.

The other manufacturing method differs from the former manufacturing method according to the second embodiment in that a tape material is used. The other manufacturing method is the same as the former manufacturing method according to the second embodiment in other respects.

Figure 10A:
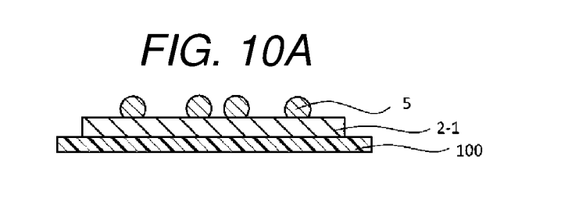
FIGS. 10A and 10B are sectional views of a semiconductor device during steps of the manufacturing method according to the second embodiment.

As illustrated in FIG. 10A, an adhesive tape material 100 is prepared and the semiconductor chip 2-1 on which the metal bumps 5 are formed is adhesively bonded onto the tape material 100. A shape and a material of the tape material 100 can be selected arbitrarily as long as the tape material 100 is, for example, a single-sided adhesive tape material. Subsequently, the chip stacked body is formed similarly to the former manufacturing method according to the second embodiment. The tape material 100 is peeled off from the chip stacked body after the metal bumps 5 of the chip stacked body are electrically connected to the through silicon vias in the reduction atmosphere or the like. The tape material 100 is peeled off by, for example, a pickup tool A and a vacuum chuck tool B.

Figure 10B:
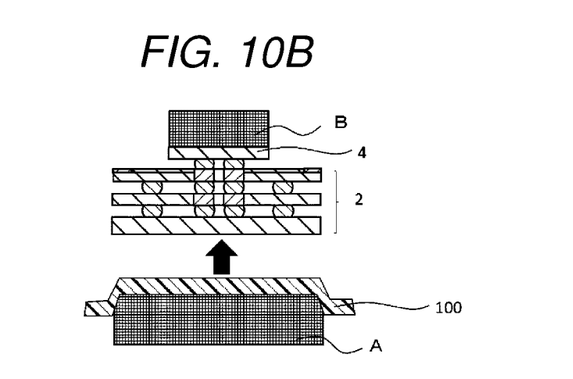

FIG. 10B illustrates a method for peeling off the tape material 100 using the pickup tool A and the vacuum chuck tool B. The chip stacked body is lifted up by the pickup tool A and, at the same time, the semiconductor chip 4 in the chip stacked body is attracted by the vacuum chuck tool B. Thereby, the tape material 100 can be peeled off from the chip stacked body. The semiconductor chip to be attracted at this time may be any of the semiconductor chips 2. Subsequently, the other manufacturing method is the same as the former manufacturing method described in the second embodiment.

The other semiconductor device manufacturing method according to the present embodiment described so far exhibits the same advantages as those of the first embodiment, and further can achieve a reduction in an area of the semiconductor device since the tape material is peeled off later as compared with the first embodiment.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a wiring substrate comprising a first surface;
a stacked body on the first surface, the stacked body comprising a first chip, a second chip between the first chip and the first surface, and a third chip between the second chip and the first surface, the second chip having a through via;
a first resin contacting the first surface and the second chip;
a second resin sealing the stacked body, a portion of the second resin being between the wiring substrate and the stacked body; and
a bump electrode electrically and physically connecting the wiring substrate and the stacked body, wherein
the bump electrode is at a distance further from a central portion of the wiring substrate than the first resin, and
the first and second resins are made of different materials.

2. The semiconductor device according claim 1, wherein the bump electrode is between the wiring substrate and the second chip.

3. The semiconductor device according to claim 1, wherein the first resin and a portion of the second resin is between the bump electrode and the third chip in a direction parallel to the first surface.

4. The semiconductor device according to claim 1, wherein the bump electrode comprises at least one of gold, nickel, copper, tin, bismuth, zinc, indium, aluminum, or palladium.

5. The semiconductor device according to claim 1, further comprising:
an adhesive resin between the first, second, and third chips.

6. The semiconductor device according to claim 1, further comprising:
a fourth chip on the stacked body.

7. The semiconductor device according to claim 1, wherein,
the bump electrode electrically connects the second chip directly to the wiring substrate,
the first resin is between the bump electrode and the third chip in a direction parallel to the first surface, and
a portion of the second resin is between the first resin and the third chip in the direction parallel to the first surface.

8. A packaged semiconductor device, comprising:
a wiring substrate having a first surface;
a first semiconductor chip having a second surface facing the first surface and a third surface opposite the second surface;
a bump electrode between the first semiconductor chip and the wiring substrate and contacting the second surface and the first surface;
a first adhesive between the first semiconductor chip and the wiring substrate and contacting the second surface and the first surface;
a second semiconductor chip on the third surface;
a support substrate on the second semiconductor chip, the second semiconductor chip between the support substrate and the first chip;
a third semiconductor chip on the second surface, the third semiconductor chip being between the first semiconductor chip and the wiring substrate, the first adhesive being between the third semiconductor chip and the bump electrode in a direction parallel to the first surface; and
a sealing resin covering the support substrate, the first semiconductor chip, the second semiconductor chip, the third semiconductor chip and the first surface of the wiring substrate, wherein
the sealing resin is between the first adhesive and the third semiconductor chip in the direction parallel to the first surface and between the third semiconductor chip and the first surface, and
the first adhesive and the sealing resin being different materials.

9. The packaged semiconductor device according to claim 8, further comprising:
a plurality of solder balls on a surface of the wiring substrate opposite the first surface.

10. The packaged semiconductor device according to claim 8, further comprising:
a fourth semiconductor chip between the second semiconductor chip and the support substrate.

11. The packaged semiconductor device according to claim 8, wherein
the first and second semiconductor chips are memory chips, and
the third chip is a logic chip.

12. The packaged semiconductor device according to claim 8, wherein
the first and second semiconductor chips are NAND flash memory chips, and
the third semiconductor chip is a LSI chip.

13. The packaged semiconductor device according to claim 8, wherein the second semiconductor chip includes a through-via.

14. The packaged semiconductor device according to claim 8, further comprising:
a solder ball between the first and second semiconductor chips;
a second adhesive between the first and second semiconductor chips, wherein
the sealing resin is also between the first and second semiconductor chips.

15. The package semiconductor device according to claim 8, wherein the bump electrode comprises at least one of gold, nickel, copper, tin, bismuth, zinc, indium, aluminum, or palladium.

* * * * *